US011802917B1

(12) United States Patent
Walther et al.

(10) Patent No.: US 11,802,917 B1
(45) Date of Patent: Oct. 31, 2023

(54) IMPEDANCE MEASUREMENTS IN BATTERY MANAGEMENT CIRCUITS

(71) Applicant: Infineon Technologies AG, Neubiberg (DE)

(72) Inventors: Christian Walther, Munich (DE); Markus Ekler, Feldkirchen (DE); Christian Heiling, Graz (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/664,970

(22) Filed: May 25, 2022

(51) Int. Cl.
*G01R 31/389* (2019.01)
*G01R 31/3842* (2019.01)
*G01R 31/396* (2019.01)

(52) U.S. Cl.
CPC ....... *G01R 31/389* (2019.01); *G01R 31/3842* (2019.01); *G01R 31/396* (2019.01)

(58) Field of Classification Search
None
See application file for complete search history.

(56) References Cited

U.S. PATENT DOCUMENTS 6,002,238 A * 12/1999 Champlin ............ G01R 31/389
320/DIG. 12
2013/0176016 A1 * 7/2013 Kang .................... H03M 1/002
341/143
2014/0163912 A1 * 6/2014 Gao ...................... G01R 31/34
702/65
2017/0254859 A1 * 9/2017 Christophersen .... G01R 31/382

OTHER PUBLICATIONS

"Electrochemical Impedance Spectroscopy (EIS) for Batteries", Analog Devices, retrieved from : https://www.analog.com/en/design-center/reference-designs/circuits-from-the-lab/cn0510.html#trd-overview, Accessed on May 24, 2022, 17 pp.
"TLE9012DQU: Li-ion battery monitoring and balancing IC", Infineon, Retrieved from: https://www.infineon.com/dgdl/Infineon-TLE9012DQU-DataSheet-v01_00-EN.pdf?fileId= 8ac78c8c7e7124d1017f0c3d27c75737, Accessed on: May 24, 2022, 76 pp.

* cited by examiner

*Primary Examiner* — Jas A Sanghera
(74) *Attorney, Agent, or Firm* — Shumaker & Sieffert, P.A.

(57) ABSTRACT

A process for determining an impedance of a battery cell may comprise delivering an excitation current to the battery cell; performing, via an analog-to-digital converter (ADC), one or more first measurements associated with the battery cell in the presence of the excitation current, wherein the one or more first measurements comprise one or more current measurements; performing, via the ADC, one or more second measurements associated with the battery cell in the presence of the excitation current, wherein the one or more second measurements comprise one or more voltage measurements; and determining the impedance of the battery cell based on the one or more first measurements and the one or more second measurements.

18 Claims, 9 Drawing Sheets

IMPEDANCE MEASUREMENTS IN BATTERY MANAGEMENT CIRCUITS

TECHNICAL FIELD

This disclosure relates to battery management circuits, and more specifically, circuits configured to perform one or more battery cell monitoring functions for a plurality of battery cells.

BACKGROUND

Battery powered devices, such as electric vehicles, often include many battery cells connected in series to form a battery system for the battery powered device. For such battery systems, battery management systems (BMSs) are often used for battery cell monitoring, thermal monitoring, cell balancing of different battery cells or different sets of battery cells, or other battery management functions.

BMSs often use several different battery monitoring circuits in order to monitor all of the battery cells of a battery powered device. For example, each of the battery monitoring circuits may monitor a subset of the battery cells of a battery system that is used to provide power to a battery powered device. The number of channels for each battery monitoring circuit, however, may be limited, and therefore, several battery monitoring circuits may be needed within a BMS in order to monitor all of the cells of a battery system.

For example, an electrical vehicle may include a battery system with one hundred or more lithium-ion battery cells connected in series, but battery monitoring circuits may include a more limited number of channels, e.g., only twelve channels. In this case, nine battery monitoring circuits may be needed within a BMS to monitor all one hundred cells of the battery system.

In BMS systems, battery cell impedance measurements are desirable. The so-called "complex impedance" of battery cells, however, can be more difficult to obtain than simple resistance measurements. Battery cell impedance can be affected by many factors, such as the battery cell structure, operational temperature changes, aging, state of charge, atmospheric pressure, environmental exposure, or other factors.

SUMMARY

In general, this disclosure is directed to techniques and circuits for determining the complex impedance of one or more battery cells among a plurality of battery cells in a battery system. The techniques for determining the complex impedance of a battery cell may involve multiple different measurements on the battery cell in the presence of an excitation current. The circuits and techniques may be used within a battery management system (BMS), such as BMS of an electric vehicle.

In some examples, multiplexing techniques can be used so that a same analog-to-digital converter (ADC) can be used for both the current and voltage measurements. Moreover, in some examples, the same ADC can be used in determining the complex impedance of several different battery cells, which may be arranged in series.

In some examples, this disclosure describes a circuit configured to determine an impedance of a battery cell. The circuit may comprise a current excitation unit configured to deliver an excitation current to the battery cell, and an ADC configured to: perform one or more first measurements associated with the battery cell in the presence of the excitation current, wherein the one or more first measurements comprise one or more current measurements, and perform one or more second measurements associated with the battery cell in the presence of the excitation current, wherein the one or more second measurements comprise one or more voltage measurements, wherein the impedance of the battery cell is based on the one or more first measurements and the one or more second measurements.

In some examples, this disclosure describes a method of determining an impedance of a battery cell. The method may comprise delivering an excitation current to the battery cell, and performing, via an ADC, one or more first measurements associated with the battery cell in the presence of the excitation current, wherein the one or more first measurements comprise one or more current measurements. The method may also comprise performing, via the ADC, one or more second measurements associated with the battery cell in the presence of the excitation current, wherein the one or more second measurements comprise one or more voltage measurements. The method further comprises determining the impedance of the battery cell based on the one or more first measurements and the one or more second measurements.

In some examples, this disclosure describes a BMS configured to monitor a plurality of battery cells arranged in series. The BMS may comprise a first battery management circuit configured to monitor a first subset of the plurality of battery cells, and a second battery management circuit configured to monitor a second subset of the plurality of battery cells, wherein the second subset is different than the first subset. The first battery monitoring circuit and the second battery monitoring circuit may each comprise an impedance measurement circuit configured to determine an impedance of a given battery cell. The impedance measurement circuit may comprise a current excitation unit configured to deliver an excitation current to the given battery cell, and an ADC configured to: perform one or more first measurements associated with the given battery cell in the presence of the excitation current, wherein the one or more first measurements comprise one or more current measurements, and perform one or more second measurements associated with the given battery cell in the presence of the excitation current, wherein the one or more second measurements comprise one or more voltage measurements, wherein the impedance of the given battery cell is based on the one or more first measurements and the one or more second measurements.

Details of these and other examples are set forth in the accompanying drawings and the description below. Other features, objects, and advantages will be apparent from the description and drawings, and from the claims.

DETAILED DESCRIPTION

Figure 1:
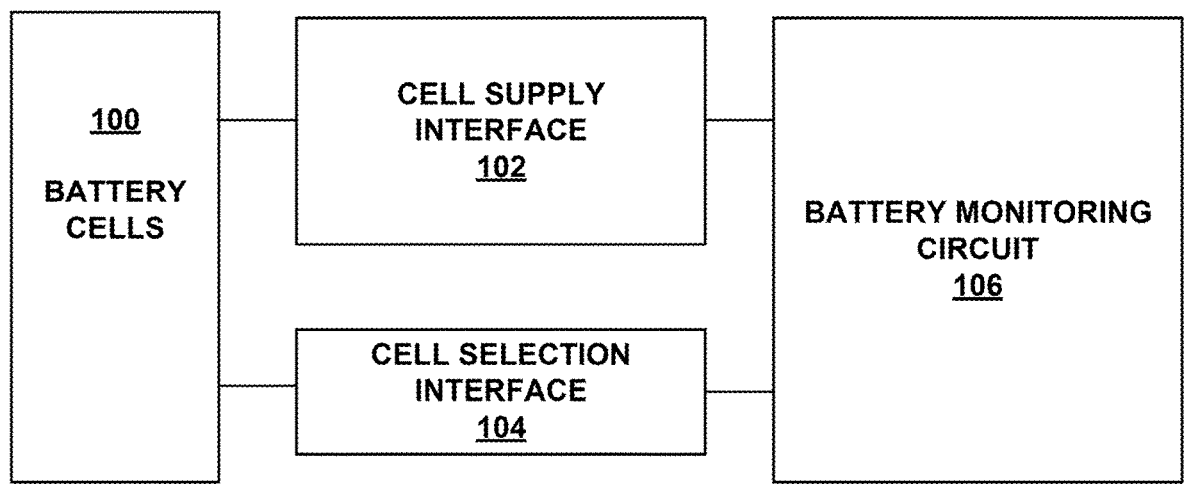
FIG. 1 is a block diagram showing battery cells and a battery monitoring system (BMS) that includes a battery monitoring circuit.

This disclosure is directed to circuits and techniques for determining the complex impedance of one or more battery cells among a plurality of battery cells in a battery powered system. The circuits and techniques may be used within a battery management system (BMS), such as BMS of an electric vehicle or other battery powered devices that include battery monitoring or battery management capabilities. The complex impedance determinations may be used by the BMS for one or more battery management functions, such as cell monitoring, thermal monitoring, cell balancing, or other battery management functions.

According to this disclosure, current measurements and voltage measurements of a battery cell are performed in the presence of an excitation current applied to a battery cell. In some examples, multiplexing techniques can be used so that a same analog-to-digital converter (ADC) can be used for both the current and voltage measurements. Moreover, in some examples, the same ADC can be used in determining the complex impedance of several different battery cells, which may be arranged in series.

The measurement of complex impedance of battery cells, such as lithium-ion battery cells can be useful to help determine various attributes of the battery, such as inner cell temperature and state of health (SoH). To determine the complex electrical impedance, the measured battery cell has to be excited with an alternating stimulus signal. In some cases, the stimulus may be applied at different frequencies. During this excitation, the cell voltage and the excitation current should be measured during the same or similar time interval, and measurements may be synchronized to the excitation frequency.

Using two synchronized measurement units to measure voltage and current signals separately and simultaneously, however, has drawbacks in terms of circuit costs and system level complexities. Moreover, multi-cell battery scenarios, such as used in electric vehicles, can further complicate the circuitry insofar as multiple circuits may be needed to monitor the multiple cells.

Multi-cell battery management solutions may include 12 channels, 16 channels, or possibly more channels for each battery monitoring circuit. Adding two additional ADCs for each channel, for impedance measuring purposes, are neither technically feasible due to current consumption, power dissipation, and package area, nor economically reasonable due to costs.

In some examples of this disclosure, a circuit may be configured to perform cell excitation in a steady-state condition and measure voltage and current sequentially instead of simultaneously. In this way, the measurement circuitry can be simplified e.g. by using a single ADC for current and voltage measurement for a given cell. Moreover, by using a more complex multiplexing structure, a single ADC can be connected sequentially to each cell in a multi-cell battery management device to acquire the complex cell impedance one after the other. The ADC may comprise an alternating current (AC)-ACC, which may be necessary for complex impedance determinations.

FIG. 1 is a block diagram showing battery cells and a BMS that includes a supply interface circuit 102 and a battery monitoring circuit 106 used to monitor battery cells 100. Battery cells 100 may comprise a set of battery cells connected in series. In order to monitor battery cells, supply interface circuit 102 uses power from battery cells 100 to supply power to cell selection interface circuit 104 and battery monitoring circuit 106. Cell selection interface circuit 104 individually connects each cell within battery cells 100 to battery monitoring circuit 106 so that battery monitoring circuit 106 can monitor each cell, such as by measuring or tracking the potential energy stored in each cell. For example, cell selection unit 104 may comprise circuit elements that form a multiplexer, one or more switch(es) and wires, or another type of selection interface that can individually connect each cell within battery cells 100 to battery monitoring circuit 106.

According to this disclosure, battery monitoring circuit 106 may be configured to perform methods for determining an impedance of one or more battery cells among battery cells 100. As described in greater detail below, battery monitoring circuit 106 may be configured to deliver an excitation current to a given battery cell, and perform, via an ADC (not shown in FIG. 1), one or more first measurements associated with the battery cell in the presence of the excitation current, wherein the one or more first measurements comprise one or more current measurements. Battery monitoring circuit 106 may also be configured to perform, via the same ADC, one or more second measurements associated with the battery cell in the presence of the excitation current, wherein the one or more second measurements comprise one or more voltage measurements. The impedance of the battery cell is based on the one or more first measurements and the one or more second measurements. Accordingly, battery monitoring circuit 106 (or possibly an external host computer) can be configured to determine the complex impedance of the battery cell based on the one or more first measurement and the one or more second measurements.

In some cases, battery monitoring circuit 106 may be configured to select, via a multiplexer (not shown in FIG. 1), a first set of signals and deliver the first set of signals to the ADC to perform the one or more first measurements in the presence of the excitation current in a first instance of time, and select, via the multiplexer, a second set of signals and deliver the second set of signals to the ADC to perform the one or more second measurements in the presence of the excitation current in a second instance of time. The first instance of time and the second instance of time occur after a settling time associated with the excitation current, e.g., to ensure that the excitation current is at steady state. The impedance may comprise a complex impedance and the excitation current may comprise an alternating current (AC) at one or more defined frequencies.

In some examples, the one or more first measurements performed by battery monitoring circuit 106 may comprise two or more first measurements associated with two or more different frequencies of the excitation current, and the one or more second measurements may comprise two or more second measurements associated with the two or more different frequencies of the excitation current.

In some examples, the method performed by battery monitoring circuit 106 may be used to determine a plurality of impedances of a plurality of battery cells, such for each of battery cells 100. For each of the battery cells 100, the method may include delivering a respective excitation current to a respective battery cell. For example, the method performed by battery monitoring circuit 106 may include performing, via the ADC, one or more first measurements associated with a first battery cell in the presence of a first excitation current, performing, via the ADC, one or more second measurements associated with the first battery cell in the presence of the first excitation current, performing, via the ADC, one or more first measurements associated with a second battery cell in the presence of a second excitation current, and performing, via the ADC, one or more second measurements associated with the second battery cell in the presence of the second excitation current. In some cases, the method may further comprise selecting, via a multiplexer, a first set of signals and deliver the first set of signals to the ADC to perform the one or more first measurements associated with the first battery cell in the presence of the first excitation current; selecting, via the multiplexer, a second set of signals and deliver the second set of signals to the ADC to perform the one or more second measurements associated with the first battery cell in the presence of the first excitation current; selecting, via the multiplexer, a third set of signals and deliver the third set of signals to the ADC to perform the one or more first measurements associated with the second battery cell in the presence of the second excitation current; and selecting, via the multiplexer, a fourth set of signals and deliver the fourth set of signals to the ADC to perform the one or more second measurements associated with the second battery cell in the presence of the second excitation current. Battery monitoring circuit 106 may be configured to perform one or more battery management functions on the plurality of battery cells 100, wherein the battery management functions are based on the plurality of determined impedances of the plurality of battery cells 100.

Figure 2:
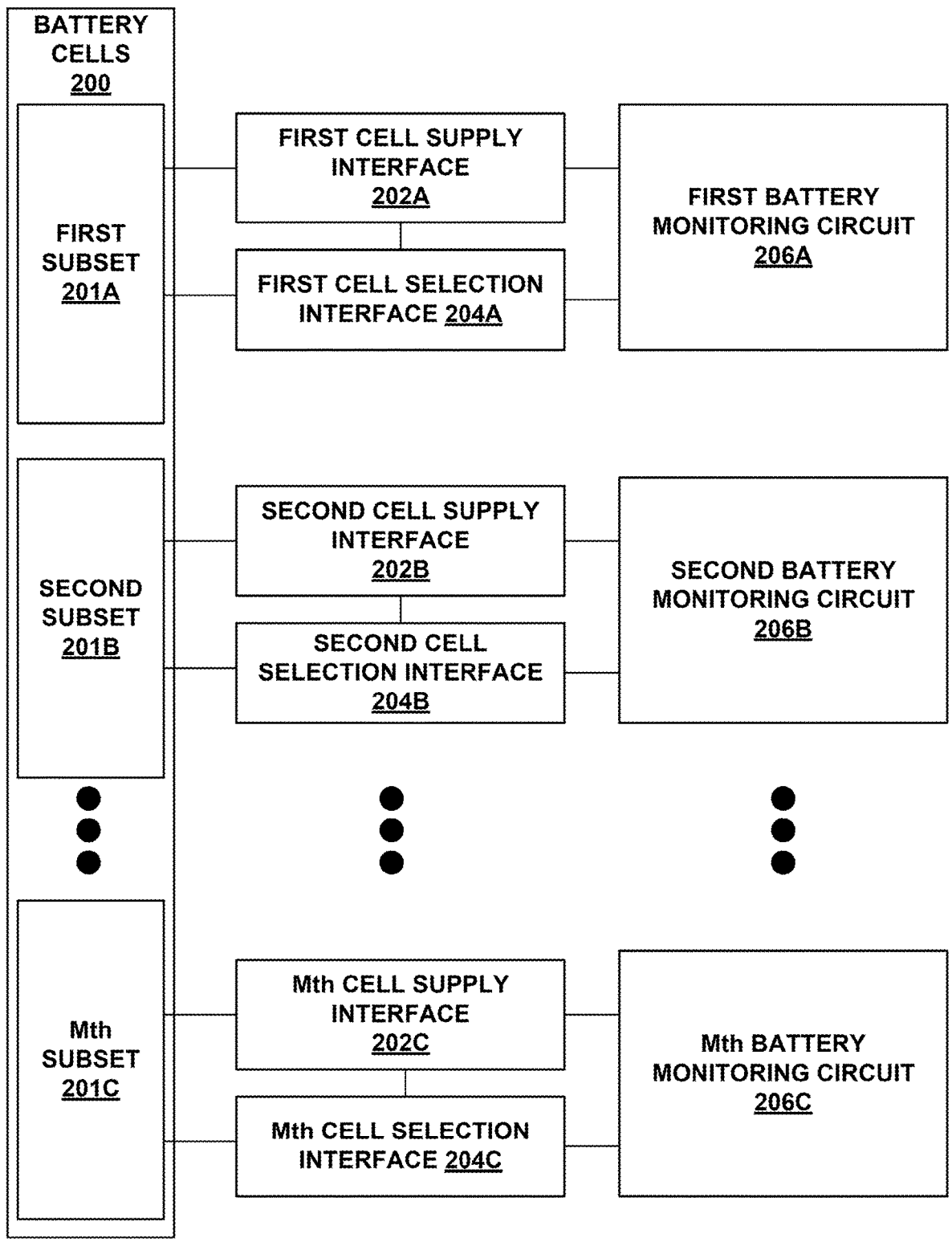
FIG. 2 is a block diagram showing battery cells and a BMS that includes several battery monitoring circuits.

FIG. 2 is a block diagram showing battery cells and a BMS that includes several battery monitoring circuits 206A, 206B, 206C for monitoring different subsets 201A, 201B, 201C of a larger set of battery cells 200. In particular, battery cells 200 may include a first subset 201A of battery cells, a second subset 201B of battery cells, and an Mth subset 201C of battery cells. In FIG. 2, "M" may represent any positive integer greater than 2. More generally, cells 200 may include any number of cells that may be divided into any number of different subsets, e.g., two or more subsets. The different subsets may have the same or different numbers of battery cells. For each of the subsets 201A, 201B, 201C of battery cells, a cell selection interface circuit 204A, 204B, 204C may individually connect each cell within a respective subset to a respective battery monitoring circuit 206A, 206B, 206C. Supply interface circuits 202A, 202B, 202C may uses power from battery cells 200 to supply power to cell selection interface circuits 204A, 204B, 204C, and to battery monitoring circuits 206A, 206B, 206C. Battery monitoring circuits 206A, 206B, 206C may be configured to monitor each individual cell within battery cells 200, such as by periodically measuring or tracking the potential energy stored in each cell. According to this disclosure, the BMS shown in FIG. 2 may be configured to monitor a plurality of battery cells 200 arranged in series. Consistent with FIG. 2, the BMS may comprise a first battery monitoring circuit 206A configured to monitor a first subset 201A of the plurality of battery cells 200; and a second battery monitoring circuit 206B configured to monitor a second subset 201B of the plurality of battery cells 200, wherein second subset 201B is different than first subset 201A.

First battery monitoring circuit 206A and second battery monitoring circuit 206B may each comprise an impedance measurement circuit configured to determine an impedance of a given battery cell. The impedance measurement circuit may comprise a current excitation unit configured to deliver an excitation current to the given battery cell, and an ADC configured to: perform one or more first measurements associated with the given battery cell in the presence of the excitation current, wherein the one or more first measurements comprise one or more current measurements, and perform one or more second measurements associated with the given battery cell in the presence of the excitation current, wherein the one or more second measurements comprise one or more voltage measurements, wherein the impedance measurement circuit is configured to determine the impedance of the given battery cell based on the one or more first measurements and the one or more second measurements.

In some examples, the impedance measurement circuit associated with each of first battery monitoring circuit 206A and second battery monitoring circuit 206B is configured to determine a plurality of impedances associated with a subset 201A or 201B of the plurality of battery cells 200, wherein for each subset of battery cells 200, a respective impedance measurement circuit includes a respective current excitation unit configured to deliver a respective excitation current to a respective battery cell. In this case, the ADC used by battery monitoring circuit 206A or 206B is configured to: perform one or more first measurements associated with a first battery cell in the presence of a first excitation current, perform one or more second measurements associated with the first battery cell in the presence of the first excitation current, perform one or more first measurements associated with a second battery cell in the presence of a second excitation current, and perform one or more second measurements associated with the second battery cell in the presence of the second excitation current.

As mentioned above, it may be undesirable to use separate ADCs for voltage and current acquisition, and it may be undesirable to require a separate excitation or cell stimulus circuit for each ADC. The techniques of this disclosure may combine the elements into a battery management circuit with a single ADC that can perform impedance measurements within a multi-cell or multi-channel setting.

Figure 3:
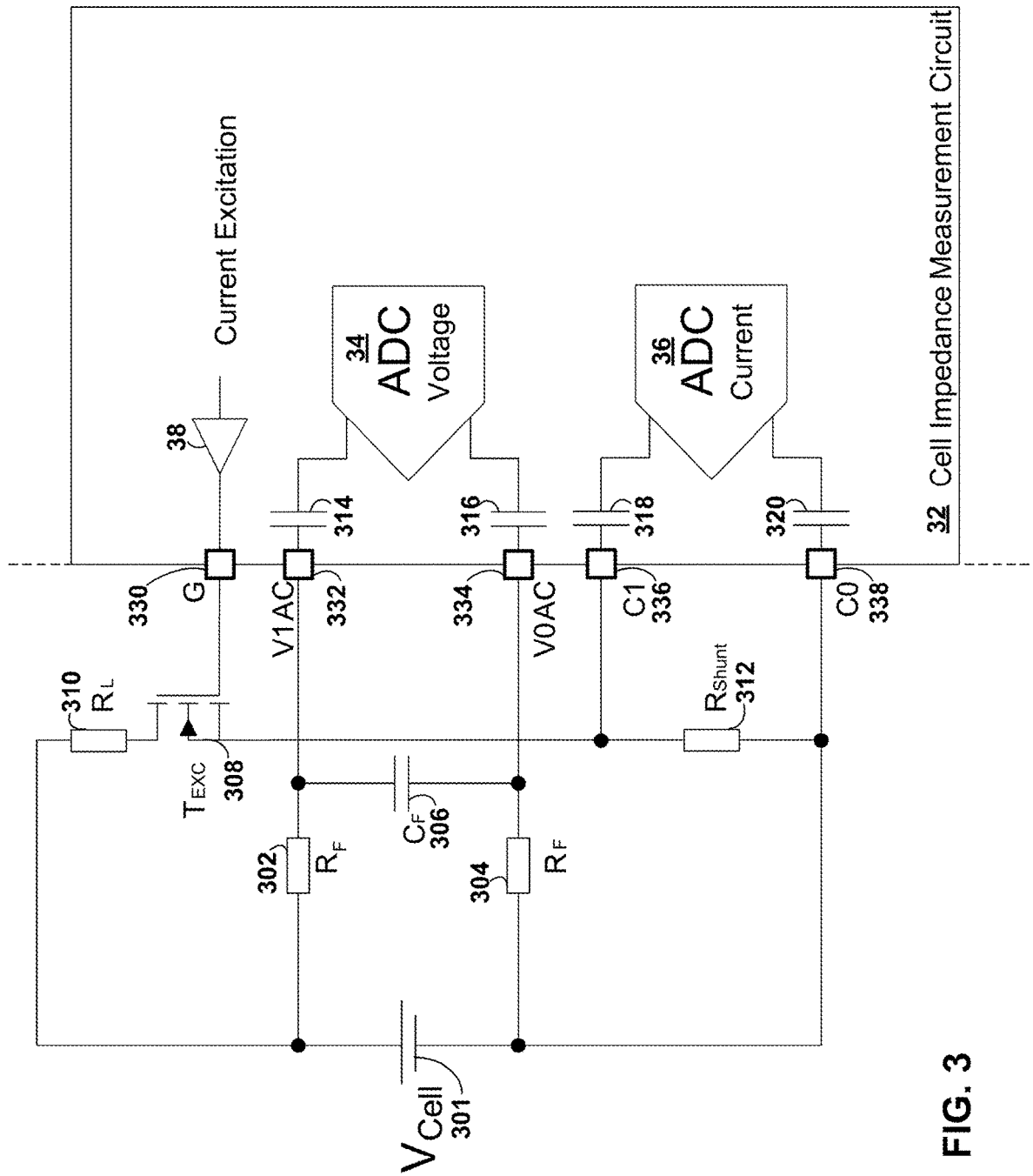
FIG. 3 is a circuit diagram showing an example cell impedance measurement circuit.

FIG. 3 shows a circuit that includes a cell impedance measurement circuit 32 that includes a current excitation unit 38, a first ADC 34 for detecting a voltage over cell 301 and a second ADC 36 for simultaneously detecting current over battery cell 301. A transistor 308 can be controlled by a control unit to introduce the excitation current, which may be based on a load (shown by load resistor 310). A shunt resistor 312 is included for the current measurement by second ADC 36. Capacitor 306 and resistors 302, 304 may comprise components of a battery system used for battery management or cell balancing with other cells (not shown). Pins 330, 332, 334, 336, and 338 may be present to allow cell impedance measurement circuit 32 to be attached to the larger circuit of FIG. 3 to make impedance determinations on battery cell 301. Capacitors 314 and 316 and capacitors 318 and 320 may define high pass filters for ADCs 34 and 36, and ADCs 34, 36 may comprise so-called AC-ADC's, which may be necessary for complex impedance determinations. The excitation current defined by current excitation unit 38 may comprise an alternating stimulus signal.

Using two synchronized measurement units to measure voltage and current signals separately and simultaneously, using cell impedance measurement circuit 32, however, has drawbacks in terms of circuit costs and system level complexities. Moreover, multi-cell battery scenarios, such as used in electric vehicles, can further complicate the circuitry insofar as multiple circuits may be needed to monitor the multiple cells.

Figure 4:
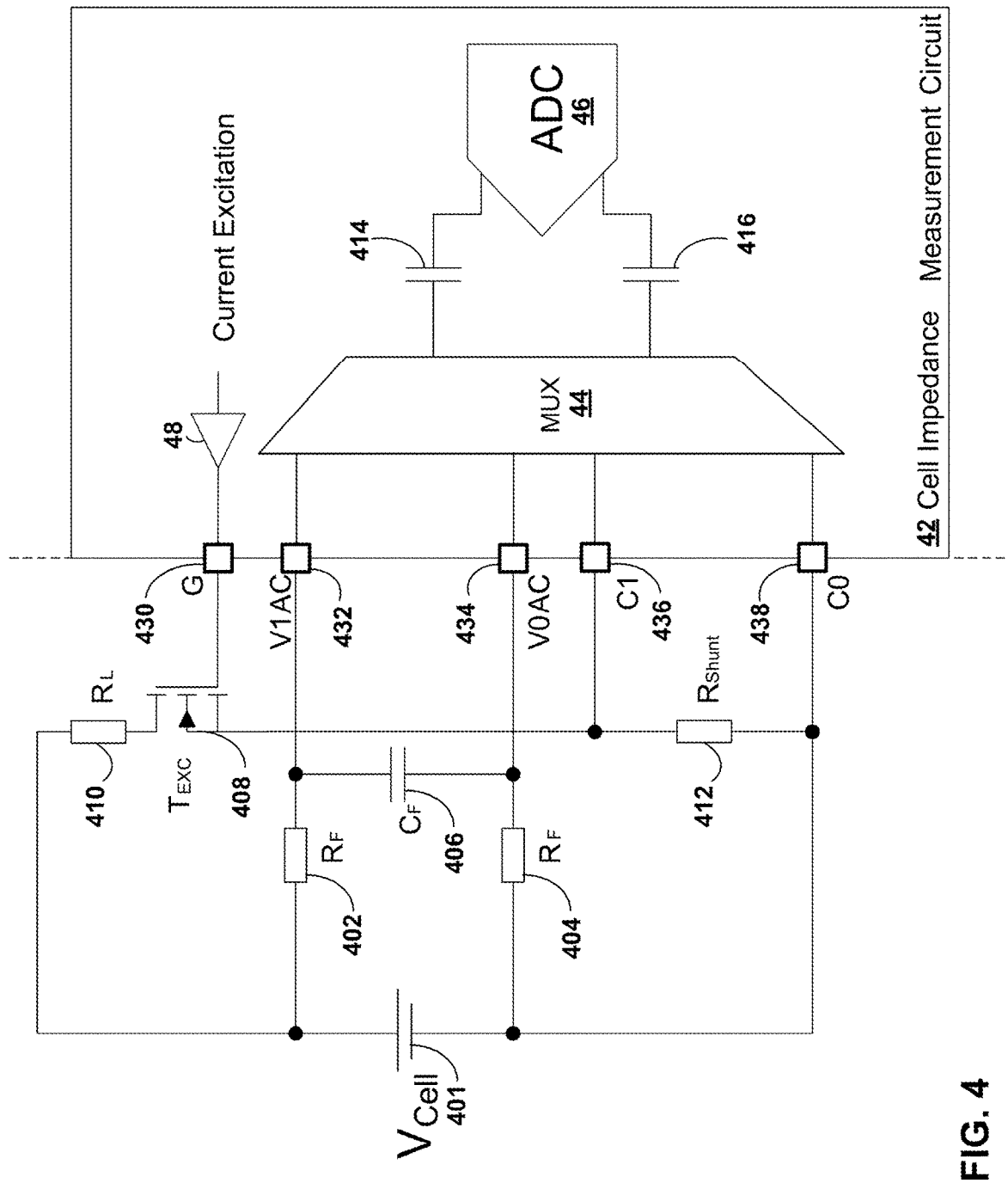
FIG. 4 is another circuit diagram showing an example cell impedance measurement circuit.

FIG. 4 is another circuit diagram showing an example cell impedance measurement circuit 42, which can provide advantages over cell impedance measurement circuit 32 of FIG. 3. In particular, rather than using two different ADCs 34, 36, as shown in FIG. 3, cell impedance measurement circuit 42 implements a single ADC 46 configured to make sequential measurements of current and voltage of cell 401. Multiplexer 44 may be configured to select signals on pins 432, 434 for a voltage measurement, and then sequentially select signals on pins 436, 428 for a current measurement. Both the current measurement and voltage measurement are made in the presence of an excitation current from excitation unit 48, and the measurements can be performed sequentially after a brief settling time associated with the alternating excitation current.

A transistor 408 can be controlled by a control unit to introduce the excitation current, which may be based on a load (shown by load resistor 410). A shunt resistor 412 is included for the current measurement by ADC 46. Capacitor 406 and resistors 402, 404 may comprise components of a battery system used for battery management or cell balancing with other cells (not shown). Pins 430, 432, 434, 436, and 438 may be present to allow cell impedance measurement circuit 42 to be attached to the larger circuit of FIG. 4 to make impedance determinations on battery cell 401. Capacitors 414 and 416 may define high pass filters for ADC 46, and ADC 46 may comprise a so-called AC-ADC, which may be necessary for complex impedance determinations. The excitation current defined by current excitation unit 48 may comprise an alternating stimulus signal.

Cell impedance measurement circuit 42 is one example of this disclosure in which a circuit 42 is configured to determine an impedance of a battery cell 401. In this example, cell impedance measurement circuit 42 includes current excitation unit 48 configured to deliver an excitation current to the battery cell 401. Cell impedance measurement circuit 42 also includes an ADC 46 configured to: perform one or more first measurements associated with battery cell 401 in the presence of the excitation current, wherein the one or more first measurements comprise one or more current measurements, and perform one or more second measurements associated with the battery cell in the presence of the excitation current, wherein the one or more second measurements comprise one or more voltage measurements. In some examples, cell impedance measurement circuit 42 is configured to determine the impedance of the battery cell based on the one or more first measurements and the one or more second measurements. For example, cell impedance measurement circuit 42 may be configured to apply Ohm's law based on the first and second measurements to determine the complex impedance. Because of the presence of the oscillating excitation current, the measurements may have both real and imaginary components, thus producing a complex impedance calculation that also includes real and imaginary components.

In the example of FIG. 4, the current and voltage measurements by ADC 46 are made sequentially rather than simultaneously. However, both measurements are made in the presence of the same continuously excitation current, which is an alternating stimulus. Multiplexer 44 may be configured to select a first set of signals from pins 432, 434 and deliver the first set of signals to ADC 46 to perform the one or more first measurements in the presence of the excitation current in a first instance of time, and multiplexer 44 may be configured to select a second set of signals and deliver the second set of signals to ADC 46 to perform the one or more second measurements in the presence of the excitation current in a second instance of time. The first instance of time and the second instance of time may be sequential and may occur after a settling time associated with the excitation current. The measured impedance may comprise a complex impedance, and the excitation current may comprise an alternating current at one or more defined frequencies.

In some examples, ADC 46 may be configured to make two or more first measurements associated with two or more different frequencies of the excitation current, and ADC 46 may be configured to make two or more second measurements associated with the two or more different frequencies of the excitation current. In some examples, ADC 46 comprises an AC sigma-delta ADC that includes capacitors 414, 416 configured to operate as high-pass filters.

Figure 5:
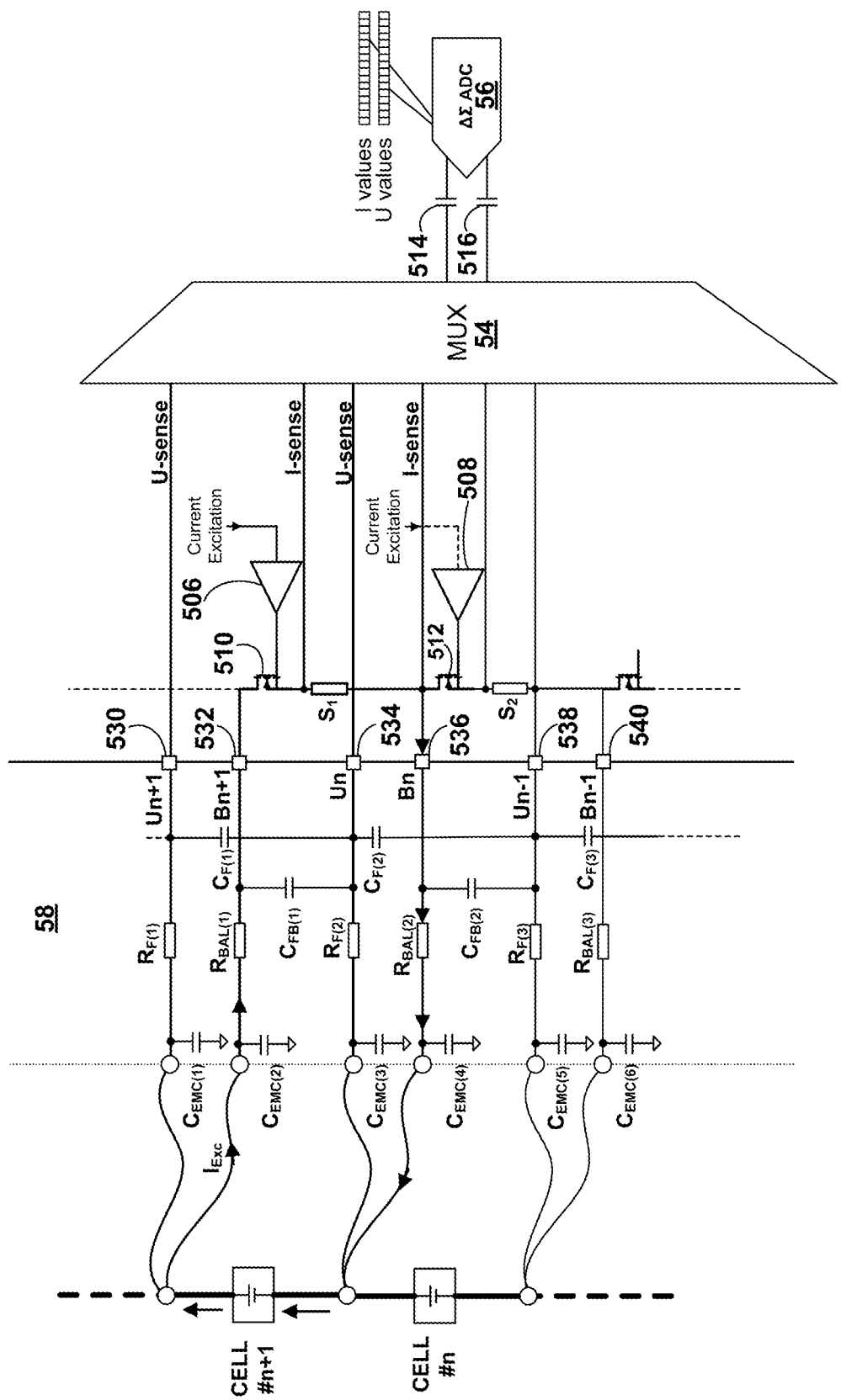
FIG. 5 is a circuit diagram showing an example cell impedance measurement circuit within a larger circuit system.

FIG. 5 is another circuit diagram showing yet another example that includes a cell impedance measurement circuit, which can provide advantages over cell impedance measurement circuit 32 of FIG. 3 and additional advantage over cell impedance measurement circuit 42 of FIG. 4. Like the example of FIG. 4, in the cell impedance measurement circuit in FIG. 5, rather than using two different ADCs 34, 36 shown in FIG. 3, the cell impedance measurement circuit in FIG. 5 implements a single ADC, e.g., sigma delta ADC 56 configured to make sequential measurements of current and voltage of a cell, e.g., cell #n+1 shown in FIG. 5. Multiplexer 54 may be configured to select signals on pins 530, 532 for a voltage measurement, and then sequentially select signals on pins 534, 536 for a current measurement. Both the current measurement and voltage measurement are made in the presence of an excitation current from excitation unit 506, and the measurements can be performed sequentially after a brief settling time associated with the alternating excitation current.

A transistor 510 can be controlled by a control unit to introduce the excitation current from current excitation unit 506, which may be based on a load or another current source (not shown in FIG. 5). A shunt resistor S1 is included for the current measurement by sigma delta ADC 54. Capacitors 514 and 516 are configured to operate as high pass filters for sigma delta ADC 56, and sigma delta ADC 46 may comprise a so-called AC-ADC, which may be necessary for complex impedance determinations. The excitation current defined by current excitation unit 506 may comprise an alternating stimulus signal.

Components 58 are shown in one example configuration. In this non-limiting example, components 58 include capacitors $C_{EMC(1)}$, $C_{EMC(2)}$, $C_{EMC(3)}$, $C_{EMC(4)}$, $C_{EMC(5)}$, $C_{EMC(6)}$ connected to various nodes associated with battery cells #n+1 and #n. $C_{EMC}$ Capacitors generally refer to capacitors configured to provide electromagnetic compatibility. Resistors $R_{F(1)}$, $R_{F(2)}$, $R_{F(3)}$, $R_{BAL(1)}$, $R_{BAL(2)}$, $R_{BAL(3)}$ are also connected to various nodes associated with battery cells #n+1 and #n and may be used for cell balancing or other battery management functions. $R_F$ resistors may refer to filtering resistors and $R_{BAL}$ resistors may refer to resistors configured to dissipate balancing power. Capacitors $C_{FB(1)}$ and $C_{FB(2)}$ are positioned respectively between nodes associated with resistors $R_{BAL(1)}$ and $R_{F(2)}$ and between nodes associated with resistors $R_{BAL(2)}$ and $R_{F(3)}$. Capacitors $C_{F(1)}$, $C_{F(2)}$, $C_{F(3)}$ are positioned respectively between nodes associated with resistors $R_{F(1)}$ and $R_{BAL(1)}$, between nodes associated with resistors $R_{F(2)}$ and $R_{BAL(2)}$, and between nodes associated with resistors $R_{F(3)}$ and $R_{BAL(3)}$. $C_F$ capacitors may refer to filtering capacitors and $C_{FB}$ capacitors may refer to capacitors configured for filtering and balancing. Components 58 can be viewed collectively as one example of cell management components that can facilitate cell balancing functions or other battery management functions.

With the example shown in FIG. 5, after performing measurements for impedance determinations of cell #n+1, the same ADC, e.g., sigma delta ADC 56, can be used to make measurements for impedance determinations of cell #n. In this case, after selecting signals on pins 530, 534 for a voltage measurement, and then sequentially select signals on pins 532, 536 for a current measurement, multiplexer 54 may be configured to select signals on pins 534, 538 for a voltage measurement, and then sequentially select signals on pins 536, 540 for a current measurement. Both the current measurement and voltage measurement for cell #n are made in the presence of an excitation current from excitation unit 508, and the measurements can be performed sequentially after a brief settling time associated with the alternating excitation current. Two battery cells (#n and #n+1) are shown in FIG. 5, but the circuit can be configured to repeat the process to sequentially measure complex impedance for any number of battery cells.

Transistors 510, 512, can be controlled by a control unit to introduce the excitation current from current excitation units 506, 508, which may be based on a load or another current source (not shown in FIG. 5). A shunt resistor S1, S2 is included for each cell for the current measurement by sigma delta ADC 54. Capacitors 514 and 516 may define high pass filters for sigma delta ADC 56, and sigma delta ADC 46 may comprise a so-called AC-ADC, which may be necessary for complex impedance determinations. The excitation current defined by current excitation units 506, 508 may comprise an alternating stimulus signal. Additional excitation units (similar to current excitation units 506, 508) may be includes for measuring complex impedance of other battery cells (not shown).

Elements 510, 512, S1, S2, 506, 508, 54, 514, 516 and 56 can be viewed as a cell impedance measurement circuit of this disclosure configured to determine an impedance of a battery cell #n+1. In this example, the cell impedance measurement circuit includes current excitation unit 510 configured to deliver an excitation current to battery cell #n+1. The cell impedance measurement circuit also includes a sigma delta ADC 56 configured to: perform one or more first measurements associated with battery cell #n+1 in the presence of the excitation current, wherein the one or more first measurements comprise one or more current measurements, and perform one or more second measurements associated with battery cell #n+1 in the presence of the excitation current, wherein the one or more second measurements comprise one or more voltage measurements. The cell impedance measurement circuit is configured to determine the impedance of the battery cell based on the one or more first measurements and the one or more second measurements.

Similar to the example shown in FIG. 4, with the circuit shown in FIG. 5, the current and voltage measurements by sigma delta ADC 56 are made sequentially rather than simultaneously. However, both measurements are made in the presence of the same continuously excitation current, which is an alternating stimulus. Multiplexer 54 may be configured to select a first set of signals and deliver the first set of signals to sigma delta ADC 56 to perform the one or more first measurements in the presence of the excitation current in a first instance of time, and multiplexer 54 may be configured to select a second set of signals and deliver the second set of signals to sigma delta ADC 56 to perform the one or more second measurements in the presence of the excitation current in a second instance of time. The first instance of time and the second instance of time may be sequential and may occur after a settling time associated with the excitation current. The measured impedance may comprise a complex impedance, and the excitation current may comprises an alternating current at one or more defined frequencies.

In some examples, sigma delta ADC 56 may be configured to make two or more first measurements associated with two or more different frequencies of the excitation current, and sigma delta ADC 56 may be configured to make two or more second measurements associated with the two or more different frequencies of the excitation current. In some examples, sigma delta ADC 56 comprises an AC sigma-delta ADC that includes capacitors 514, 516 operating as high-pass filters.

Again, with the example shown in FIG. 5, after performing measurements for impedance determinations of cell #n+1, the same ADC, e.g., sigma delta ADC 56 can be used to make measurements for impedance determinations of cell #n. In this case, after selecting signals on pins 530, 534 for a voltage measurement, and then sequentially select signals on pins 533, 536 for a current measurement, multiplexer 54 may be configured to select signals on pins 534, 538 for a voltage measurement, and then sequentially select signals on pins 536, 540 for a current measurement.

Thus, the circuit shown in FIG. 5 is an example circuit that may be configured to determine a plurality of impedances of a plurality of battery cells. For each of the battery cells #n+1 and #n (and possibly additional cells), the circuit includes a respective current excitation unit 506, 508 configured to deliver a respective excitation current to a respective battery cell. In this case, sigma delta ADC 56 may be configured to perform one or more first measurements associated with a first battery cell #n+1 in the presence of a first excitation current from current excitation unit 506, perform one or more second measurements associated with first battery cell #n+1 in the presence of the first excitation current, perform one or more first measurements associated with a second battery cell #n in the presence of a second excitation current from current excitation unit 508, and perform one or more second measurements associated with the second battery #n cell in the presence of the second excitation current. Multiplexer 54 may be configured to select a first set of signals and deliver the first set of signals to sigma delta ADC 56 to perform the one or more first measurements associated with the first battery cell #n+1 in the presence of the first excitation current; select a second set of signals and deliver the second set of signals to sigma delta ADC 56 to perform the one or more second measurements associated with the first battery cell #n+1 in the presence of the first excitation current; select a third set of signals and deliver the third set of signals to the sigma delta ADC 56 to perform the one or more first measurements associated with the second battery cell #n in the presence of the second excitation current; and select a fourth set of signals and deliver the fourth set of signals to sigma delta ADC 56 to perform the one or more second measurements associated with the second battery cell #n in the presence of the second excitation current.

The circuit of FIG. 5 may also be configured to perform one or more battery management functions on the plurality of battery cells, e.g., using components 58. The battery management functions may be based on a plurality of determined impedances of the plurality of battery cells. For example, the one or more battery management functions may comprise cell balancing functions or other functions that are based on the determined impedances.

Figure 6:
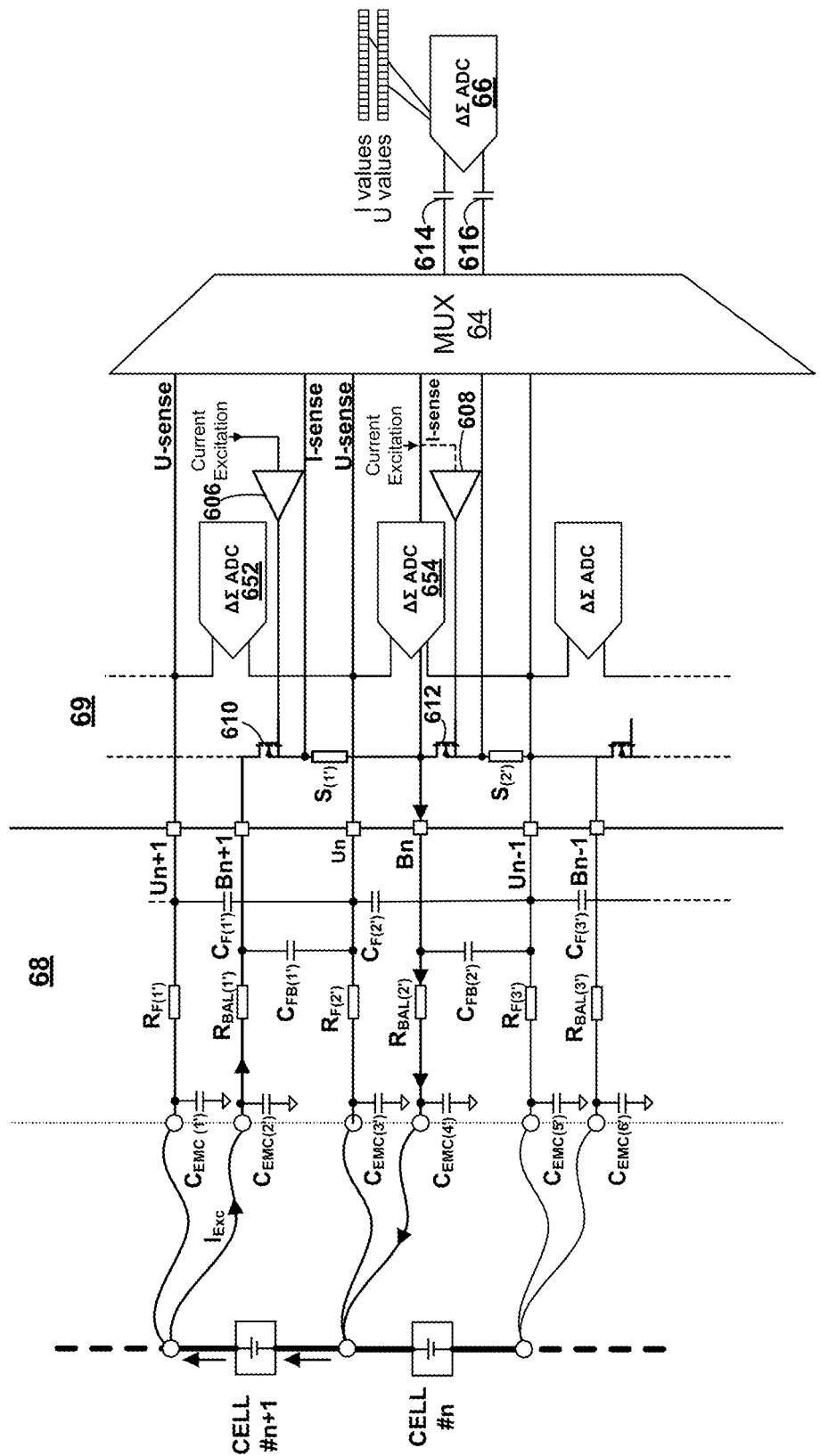
FIG. 6 is a circuit diagram showing an example cell impedance measurement circuit within a larger circuit system.

FIG. 6 is another circuit diagram showing another example that includes a cell impedance measurement circuit consistent with this disclosure. The circuit shown in FIG. 6 is similar to that of FIG. 5 in many respects, so many details of the circuit shown in FIG. 6 would operate similarly to that of FIG. 5. Components 68 are similar to components 58 and operate similarly to the description above. Elements 64, 66, 614, 616 are similar to elements 54, 56, 514, 516, and operate similarly to the description above. Elements 606, 608, 610, 612, S(1'), and S(2') are similar to elements 506, 508, 510, 512, S(1), and S(2) and operate similarly to the description above.

The example shown in FIG. 6, unlike that of FIG. 5 includes cell monitoring components 69, which may include an additional sigma delta ADC 652, 654 for each cell being monitored, transistors 610, 612, and shunts S(1'), S(2'). In some cases, cell monitoring components 69 may already be existing in the circuit for cell monitoring functions. In this case, transistors 610, 612, and shunts S(1'), S(2') used for cell monitoring can be leveraged (e.g., reused) as part of the cell impedance measurement circuit. Again, transistors 610, 612, and shunts S(1'), S(2') may operate similarly to transistors 510, 512, and shunts S(1), S(2) for cell impedance determinations, but in FIG. 6, transistors 610, 612, and shunts S(1'), S(2') may also be used for cell monitoring by sigma delta ADC's 652, 654. Reusing transistors 610, 612, and shunts S(1'), S(2') for both cell monitoring and impedance determinations is desirable in order to reduce the number of circuit elements otherwise needed for these functions.

Consistent with FIG. 6, in some examples, current stimulus can leverage already existing transistors 610, 612 to excite the battery cell. Transistors 610, 612 may comprise so-called cell balancing transistors, which again, may be re-used according to this disclosure for cell impedance determinations.

The excitation stimulus may be operated in steady-state condition until both measurements, battery cell voltage and excitation current, have been performed. The measurements can be easily synchronized to the excitation current because the excitation current is generated in the same semiconductor element as the measurements, and hence may be known to the measurement circuit. This can provide additional advantages over impedance measurement systems with centralized current excitation techniques that are not on-chip.

Figure 7:
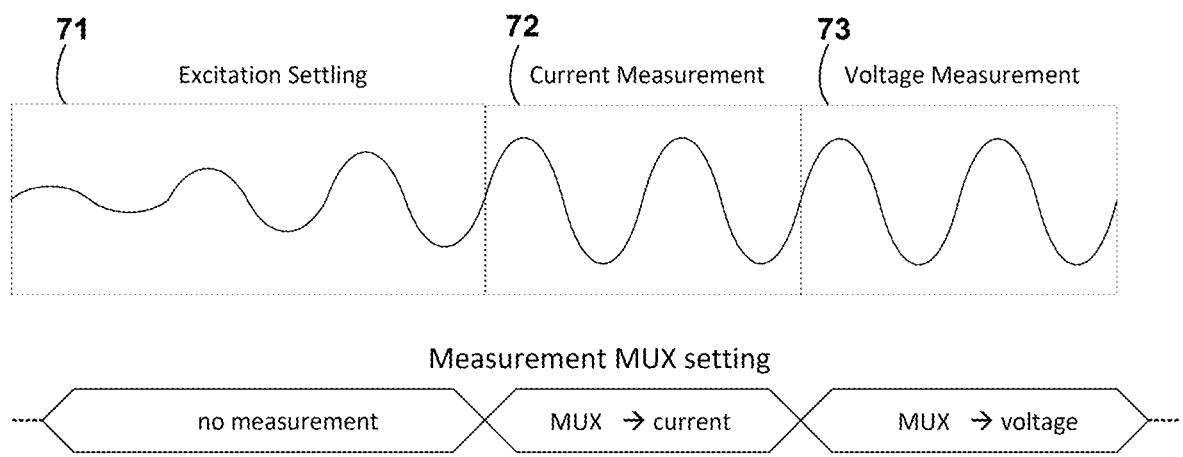
FIG. 7 is a conceptual diagram showing an excitation current and multiplexer selections for current and voltage measurements in the presence of the excitation current.

FIG. 7 is a conceptual diagram showing an excitation current and multiplexer selections for current and voltage measurements in the presence of the excitation current. As shown, excitation may include a settling time 71, followed by a current measurement 72 and a voltage measurement 73 when the excitation current is at steady state. As further show, the selections of current and voltage measurements may by synchronized with the excitation frequency. In other words, the current and voltage measurements are made during a same phase of the oscillating excitation current. For example, the waveform of the excitation current measurement 72 and during voltage measurement 73 are substantially similar or identical. As shown, a multiplexer setting can be defined for a no measurement period during the excitation settling time 71, followed by a current measurement 72 over one or more cycles, and a voltage measurement 73 over one or more cycles, wherein phase of the excitation current is synchronized for the current measurement 72 and the voltage measurement 73.

Circuits of this disclosure can calculate for the complex impedance of a battery cell, including both real and imaginary (phase shift) components. Alternatively the raw measurement data can be transferred to a central host-computer (e.g., a controller associated with the BMS) for further data processing and impedance computation. In certain applications it might make sense to do the complex impedance calculation in a central host-controller which provides high computation performance, while in other applications it may be beneficial to perform the data calculation locally in the battery management circuit in order to minimize data communication and bandwidth requirements.

Another advantage of performing the voltage and current measurements using the physically same measurement instrument (e.g., the same ADC) is that the impedance may be calculated as $Z=u(t)/i(t)$, where Z is complex impedance, $u(t)$ is the voltage measurement and $i(t)$ is the current measurement. Since the parameter of interest of such a measurement is only the complex impedance, and not the individual parameters $u(t)$ and $i(t)$, all inaccuracies of the measurement instrument with respect to gain (reference voltage) will cancel out during the calculation. This technique can therefore provide yet additional advantages compared to other impedance calculations in which a complex error compensation scheme may be needed. According to the techniques of this disclosure, error compensation can be achieved by interchanging both voltage and current sensing by the same ADC during the measurement.

In additional examples, the excitation and measurement of a given cell can be performed by additional circuitry. In other words, the excitation circuitry can either be measurement circuit, as described herein, or possibly in an external device. Using an external device for current excitation, however, may have drawbacks of additional cost, more programming or software to achieve synchronization in the signals, and possibly a reduction in accuracy e.g. due to timing challenges to achieve synchronization in the signals.

Figure 8:
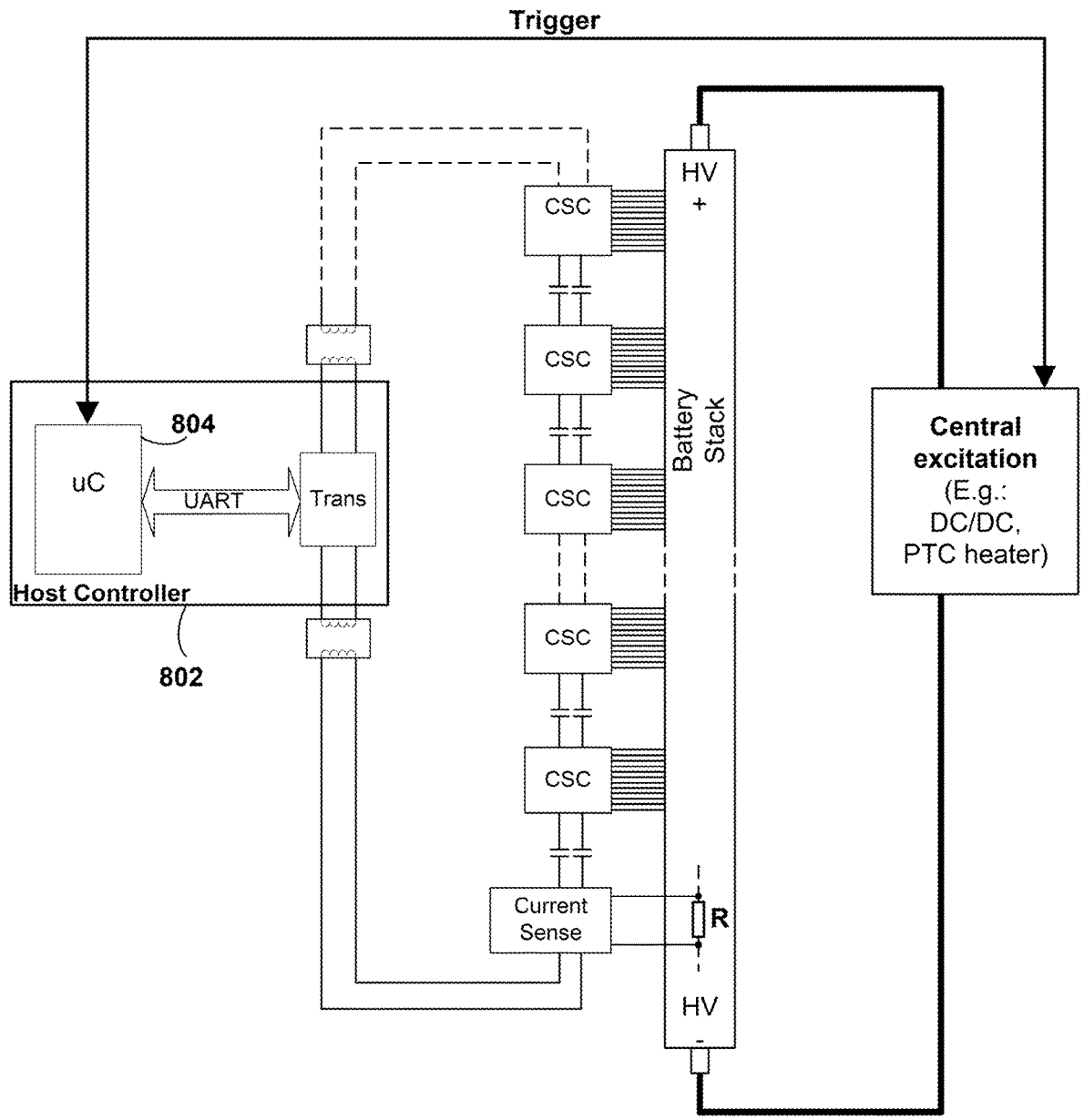
FIG. 8 is a system diagram showing an example of a battery system.

FIG. 8 is a system diagram showing an example of a battery system. A battery system of this disclosure may include a host controller 802, which may include a computer or processor (uC 804) that communicates, e.g., via a universal synchronous receiver transmitter (UART) protocol or another protocol, with a transceiver ("Trans"). Thus, host controller 802 communicates with battery monitoring units via the transceiver. Battery monitoring circuits in FIG. 8, for example, may form part of cell supervisory circuits (CSC's). Transformers (e.g., coreless transformers or other types of transformers) may facilitate communication over a galvanic isolation barrier between host controller 802 and CSCs.

CSC's shown in FIG. 8 may correspond to battery monitoring circuits described herein, although CSC's may also include other functionality. CSC's may include the impedance measurement components set forth in this disclosure. However, in the example shown in FIG. 8, host controller 804 may trigger the impedance determinations, and the excitation current may come from an external component, such as a PTC heater, a DC/DC power converter, or another external component. As mentioned above, in some examples, CSCs may compute the complex impedance based on measurements, and in other examples, host controller 804 may receive the measurements from the CSCs and host controller 804 may calculate the complex impedance based on measurements.

Figure 9:
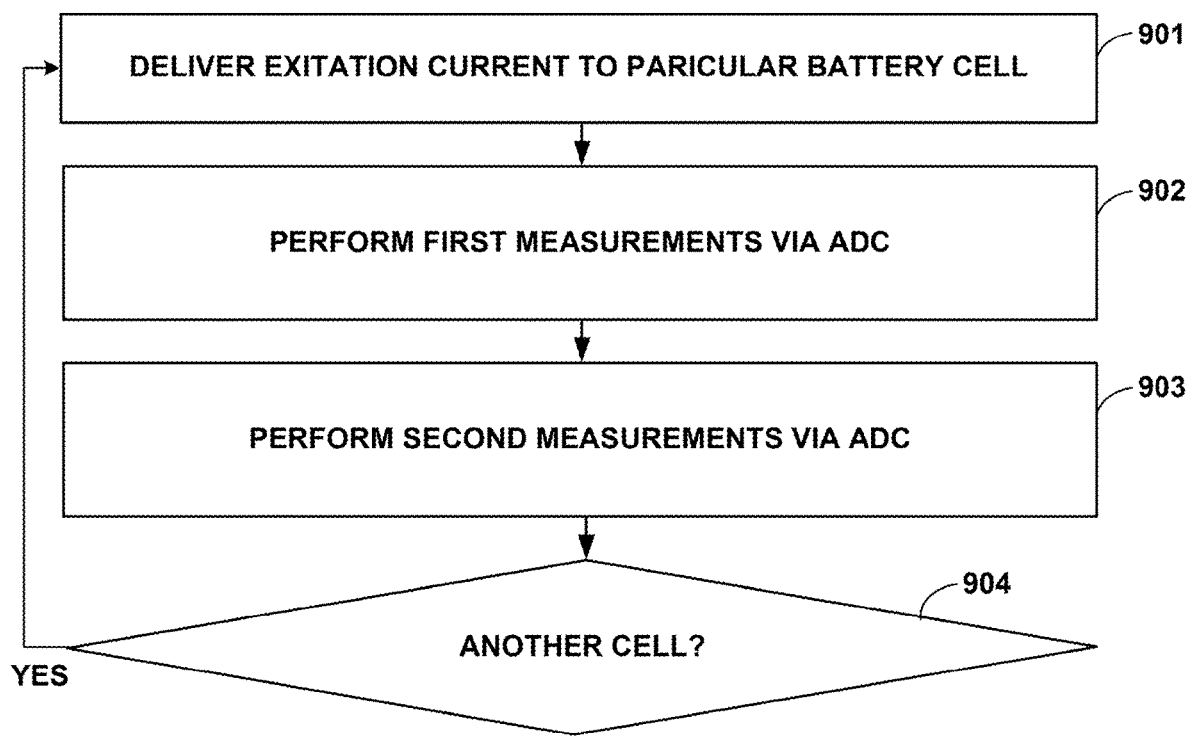
FIG. 9 is a flow diagram consistent with techniques of this disclosure.

FIG. 9 is a flow diagram consistent with techniques of this disclosure. As shown in FIG. 9, a circuit may be configured to deliver excitation current to a particular battery cell among a plurality of battery cells arranged in series (901). The circuit may perform one or more first measurements via an ADC (902), and perform one or more second measurements via the same ADC (903). The circuit may then move on to the next cell associated with the circuit, which may comprise a battery monitoring circuit with impedance measurement capabilities. If there is another cell (yes branch of 904), the process repeats for that cell, and all of the cells associated with the circuit.

The one or more first measurements may comprise current measurements in the presence of the excitation current, and the one or more second measurements may comprise voltage measurements in the presence of the excitation current. The circuit or an external host controller may then determine the impedance of the battery cells based on the one or more first measurements and the one or more second measurements.

As further describe herein, in some examples, the method shown in FIG. 9 may further include selecting, via a multiplexer, a first set of signals and deliver the first set of signals to the ADC to perform the one or more first measurements in the presence of the excitation current in a first instance of time, and selecting, via the multiplexer, a second set of signals and deliver the second set of signals to the ADC to perform the one or more second measurements in the presence of the excitation current in a second instance of time. The first instance of time and the second instance of time may occur after a settling time associated with the excitation current. The calculated impedance may comprise a complex impedance and wherein the excitation current comprises an alternating current at one or more defined frequencies.

Furthermore, in some cases, the one or more first measurements comprise two or more first measurements associated with two or more different frequencies of the excitation current, and the one or more second measurements comprise two or more second measurements associated with the two or more different frequencies of the excitation current.

The method may be used to determine a plurality of impedances of a plurality of battery cells, wherein for each of the battery cells, the method includes delivering a respective excitation current to a respective battery cell. In this case, the method may include performing, via the ADC, one or more first measurements associated with a first battery cell in the presence of a first excitation current, performing, via the ADC, one or more second measurements associated with the first battery cell in the presence of the first excitation current, performing, via the ADC, one or more first measurements associated with a second battery cell in the presence of a second excitation current, and performing, via the ADC, one or more second measurements associated with the second battery cell in the presence of the second excitation current. Moreover, in this case, the method may also include selecting, via a multiplexer, a first set of signals and deliver the first set of signals to the ADC to perform the one or more first measurements associated with the first battery cell in the presence of the first excitation current; selecting, via the multiplexer, a second set of signals and deliver the second set of signals to the ADC to perform the one or more second measurements associated with the first battery cell in the presence of the first excitation current; selecting, via the multiplexer, a third set of signals and deliver the third set of signals to the ADC to perform the one or more first measurements associated with the second battery cell in the presence of the second excitation current; and selecting, via the multiplexer, a fourth set of signals and deliver the fourth set of signals to the ADC to perform the one or more second measurements associated with the second battery cell in the presence of the second excitation current.

As described herein, in some cases, the circuit may be configured to perform one or more battery management functions on the plurality of battery cells, wherein the battery management functions are based on the plurality of determined impedances of the plurality of battery cells.

The following clauses may illustrate one or more aspects of the disclosure.

Clause 1— A circuit configured to determine an impedance of a battery cell, the circuit comprising: a current excitation unit configured to deliver an excitation current to the battery cell; and an ADC configured to: perform one or more first measurements associated with the battery cell in the presence of the excitation current, wherein the one or more first measurements comprise one or more current measurements, and perform one or more second measurements associated with the battery cell in the presence of the excitation current, wherein the one or more second measurements comprise one or more voltage measurements, wherein the impedance of the battery cell is based on the one or more first measurements and the one or more second measurements.

Clause 2— The circuit of clause 1, further comprising a multiplexer configured to: select a first set of signals and deliver the first set of signals to the ADC to perform the one or more first measurements in the presence of the excitation current in a first instance of time, and select a second set of signals and deliver the second set of signals to the ADC to perform the one or more second measurements in the presence of the excitation current in a second instance of time.

Clause 3— The circuit of clause 2, wherein the first instance of time and the second instance of time occur after a settling time associated with the excitation current.

Clause 4— The circuit of any of clauses 1-3, wherein the impedance comprises a complex impedance and wherein the excitation current comprises an AC at one or more defined frequencies.

Clause 5— The circuit of clause 4, wherein: the one or more first measurements comprise two or more first measurements associated with two or more different frequencies of the excitation current, and the one or more second measurements comprise two or more second measurements associated with the two or more different frequencies of the excitation current.

Clause 6— The circuit of any of clauses 1-5, wherein the ADC comprises an AC sigma-delta ADC that includes capacitors configured to operate as high-pass filters.

Clause 7— The circuit of any of clauses 1-6, wherein the circuit is configured to determine a plurality of impedances of a plurality of battery cells, wherein for each of the battery cells, the circuit includes a respective current excitation unit configured to deliver a respective excitation current to a respective battery cell, wherein the ADC is configured to: perform one or more first measurements associated with a first battery cell in the presence of a first excitation current, perform one or more second measurements associated with the first battery cell in the presence of the first excitation current, perform one or more first measurements associated with a second battery cell in the presence of a second excitation current, and perform one or more second measurements associated with the second battery cell in the presence of the second excitation current.

Clause 8— The circuit of clause 7, further comprising a multiplexer configured to: select a first set of signals and deliver the first set of signals to the ADC to perform the one or more first measurements associated with the first battery cell in the presence of the first excitation current; select a second set of signals and deliver the second set of signals to the ADC to perform the one or more second measurements associated with the first battery cell in the presence of the first excitation current; select a third set of signals and deliver the third set of signals to the ADC to perform the one or more first measurements associated with the second battery cell in the presence of the second excitation current; and select a fourth set of signals and deliver the fourth set of signals to the ADC to perform the one or more second measurements associated with the second battery cell in the presence of the second excitation current.

Clause 9— The circuit of clause 7 or 8, wherein the circuit is configured to perform one or more battery management functions on the plurality of battery cells, wherein the battery management functions are based on the plurality of determined impedances of the plurality of battery cells.

Clause 10— The circuit of clause 9, wherein one or more battery management functions comprise cell balancing functions.

Clause 11— A method of determining an impedance of a battery cell, the method comprising: delivering an excitation current to the battery cell; performing, via an ADC, one or more first measurements associated with the battery cell in the presence of the excitation current, wherein the one or more first measurements comprise one or more current measurements; performing, via the ADC, one or more second measurements associated with the battery cell in the presence of the excitation current, wherein the one or more second measurements comprise one or more voltage measurements; and determining the impedance of the battery cell based on the one or more first measurements and the one or more second measurements.

Clause 12— The method of clause 12, the method further comprising: selecting, via a multiplexer, a first set of signals and deliver the first set of signals to the ADC to perform the one or more first measurements in the presence of the excitation current in a first instance of time, and selecting, via the multiplexer, a second set of signals and deliver the second set of signals to the ADC to perform the one or more second measurements in the presence of the excitation current in a second instance of time.

Clause 13— The method of clause 12, wherein the first instance of time and the second instance of time occur after a settling time associated with the excitation current.

Clause 14— The method of any of clauses 11-13, wherein the impedance comprises a complex impedance and wherein the excitation current comprises an AC at one or more defined frequencies.

Clause 15— The method of clause 14, wherein: the one or more first measurements comprise two or more first measurements associated with two or more different frequencies of the excitation current, and the one or more second measurements comprise two or more second measurements associated with the two or more different frequencies of the excitation current.

Clause 16— The method of any of clauses 11-15, wherein the method determines a plurality of impedances of a plurality of battery cells, wherein for each of the battery cells, the method includes delivering a respective excitation current to a respective battery cell, wherein the method includes: performing, via the ADC, one or more first measurements associated with a first battery cell in the presence of a first excitation current, performing, via the ADC, one or more second measurements associated with the first battery cell in the presence of the first excitation current, performing, via the ADC, one or more first measurements associated with a second battery cell in the presence of a second excitation current, and performing, via the ADC, one or more second measurements associated with the second battery cell in the presence of the second excitation current.

Clause 17— The method of clause 16, further comprising: selecting, via a multiplexer, a first set of signals and deliver the first set of signals to the ADC to perform the one or more first measurements associated with the first battery cell in the presence of the first excitation current; selecting, via the multiplexer, a second set of signals and deliver the second set of signals to the ADC to perform the one or more second measurements associated with the first battery cell in the presence of the first excitation current; selecting, via the multiplexer, a third set of signals and deliver the third set of signals to the ADC to perform the one or more first measurements associated with the second battery cell in the presence of the second excitation current; and selecting, via the multiplexer, a fourth set of signals and deliver the fourth set of signals to the ADC to perform the one or more second measurements associated with the second battery cell in the presence of the second excitation current.

Clause 18— The method of clause 17, further comprising: performing one or more battery management functions on the plurality of battery cells, wherein the battery management functions are based on the plurality of determined impedances of the plurality of battery cells.

Clause 19— A BMS configured to monitor a plurality of battery cells arranged in series, the BMS comprising: a first battery monitoring circuit configured to monitor a first subset of the plurality of battery cells; and a second battery monitoring circuit configured to monitor a second subset of the plurality of battery cells, wherein the second subset is different than the first subset, wherein the first battery monitoring circuit and the second battery monitoring circuit each comprise: an impedance measurement circuit configured to determine an impedance of a given battery cell, the impedance measurement circuit comprising: a current excitation unit configured to deliver an excitation current to the given battery cell; and an analog-to-digital converter (ADC) configured to: perform one or more first measurements associated with the given battery cell in the presence of the excitation current, wherein the one or more first measurements comprise one or more current measurements, and perform one or more second measurements associated with the given battery cell in the presence of the excitation current, wherein the one or more second measurements comprise one or more voltage measurements, wherein the impedance of the given battery cell is based on the one or more first measurements and the one or more second measurements.

Clause 20— The BMS of clause 19, wherein the impedance measurement circuit associated with each of the first battery monitoring circuit and the second battery monitoring circuit is configured to determine a plurality of impedances associated with a subset of the plurality of battery cells, wherein for each subset of battery cells, a respective impedance measurement circuit includes a respective current excitation unit configured to deliver a respective excitation current to a respective battery cell, wherein the analog-to-digital converter (ADC) is configured to: perform one or more first measurements associated with a first battery cell in the presence of a first excitation current, perform one or more second measurements associated with the first battery cell in the presence of the first excitation current, perform one or more first measurements associated with a second battery cell in the presence of a second excitation current, and perform one or more second measurements associated with the second battery cell in the presence of the second excitation current.

Various aspects and examples have been described in this disclosure. These and other aspects and examples are within the scope of the following claims.

The invention claimed is:

1. A circuit configured to determine a plurality of impedances of a plurality of battery cells, the circuit comprising:
   for each of the battery cells, a respective current excitation unit configured to deliver a respective excitation current to a respective one of the plurality of battery cells; and
   an analog-to-digital converter (ADC) configured to:
      perform one or more first measurements associated with a first battery cell in the presence of a first excitation current, wherein the one or more first measurements associated with the first battery cell comprise one or more current measurements associated with the first battery cell,
      perform one or more second measurements associated with the first battery cell in the presence of the first excitation current, wherein the one or more second measurements associated with the first battery cell comprise one or more voltage measurements associated with the first battery cell,
      wherein an impedance of the first battery cell is based on the one or more first measurements associated with the first battery cell and the one or more second measurements associated with the first battery cell,
      perform one or more first measurements associated with a second battery cell in the presence of a second excitation current, wherein the one or more first measurements associated with the second battery cell comprise one or more current measurements associated with the second battery cell, and
      perform one or more second measurements associated with the second battery cell in the presence of the second excitation current, wherein the one or more second measurements associated with the second battery cell comprise one or more voltage measurements associated with the second battery cell,
      wherein an impedance of the second battery cell is based on the one or more first measurements associated with the second battery cell and the one or more second measurements associated with the second battery cell.

2. The circuit of claim 1, further comprising a multiplexer configured to:
   select a first set of signals and deliver the first set of signals to the ADC to perform the one or more first measurements associated with the first battery cell in the presence of the first excitation current in a first instance of time, and
   select a second set of signals and deliver the second set of signals to the ADC to perform the one or more second measurements associated with the first battery cell in the presence of the first excitation current in a second instance of time.

3. The circuit of claim 2, wherein the first instance of time and the second instance of time occur after a settling time associated with the excitation current.

4. The circuit of claim 1, wherein the impedance of the first battery cell comprises a complex impedance and wherein the first excitation current comprises an alternating current (AC) at one or more defined frequencies.

5. The circuit of claim 4, wherein:
   the one or more first measurements associated with the first battery cell comprise two or more first measurements associated with two or more different frequencies of the first excitation current, and
   the one or more second measurements associated with the first battery cell comprise two or more second measurements associated with the two or more different frequencies of the first excitation current.

6. The circuit of claim 1, wherein the ADC comprises an alternating current (AC) sigma-delta ADC that includes capacitors configured to operate as high-pass filters.

7. The circuit of claim 1, further comprising a multiplexer configured to:
   select a first set of signals and deliver the first set of signals to the ADC to perform the one or more first measurements associated with the first battery cell in the presence of the first excitation current;
   select a second set of signals and deliver the second set of signals to the ADC to perform the one or more second measurements associated with the first battery cell in the presence of the first excitation current;
   select a third set of signals and deliver the third set of signals to the ADC to perform the one or more first measurements associated with the second battery cell in the presence of the second excitation current; and
   select a fourth set of signals and deliver the fourth set of signals to the ADC to perform the one or more second measurements associated with the second battery cell in the presence of the second excitation current.

8. The circuit of claim 1, wherein the circuit is configured to perform one or more battery management functions on the plurality of battery cells, wherein the battery management functions are based on the plurality of determined impedances of the plurality of battery cells.

9. The circuit of claim 8, wherein one or more battery management functions comprise cell balancing functions.

10. A method of determining a plurality of impedances of a plurality of battery cells, the method comprising:
   for each of the battery cells, delivering a respective excitation current to a respective the battery cell;
   performing, via an analog-to-digital converter (ADC), one or more first measurements associated with a first the battery cell in the presence of a first excitation current, wherein the one or more first measurements associated with the first battery cell comprise one or more current measurements associated with the first battery cell;
   performing, via the ADC, one or more second measurements associated with the first battery cell in the presence of the first excitation current, wherein the one or more second measurements associated with the first battery cell comprise one or more voltage measurements associated with the first battery cell;
   determining an impedance of the first battery cell based on the one or more first measurements associated with the first battery cell and the one or more second measurements associated with the first battery cell;
   performing, via the ADC, one or more first measurements associated with a second battery cell in the presence of a second excitation current, wherein the one or more first measurements associated with the second battery cell comprise one or more current measurements associated with the second battery cell;
   performing, via the ADC, one or more second measurements associated with the second battery cell in the presence of the second excitation current wherein the one or more second measurements associated with the second battery cell comprise one or more voltage measurements associated with the second battery cell; and determining an impedance of the second battery cell based on the one or more first measurements associated with the second battery cell and the one or more second measurements associated with the second battery cell.

11. The method of claim 10, further comprising:
selecting, via a multiplexer, a first set of signals and deliver the first set of signals to the ADC to perform the one or more first measurements associated with the first battery cell in the presence of the first excitation current in a first instance of time, and selecting, via the multiplexer, a second set of signals and deliver the second set of signals to the ADC to perform the one or more second measurements associated with the first battery cell in the presence of the first excitation current in a second instance of time.

12. The method of claim 11, wherein the first instance of time and the second instance of time occur after a settling time associated with the excitation current.

13. The method of claim 10, wherein the impedance of the first battery cell comprises a complex impedance and wherein the first excitation current comprises an alternating current (AC) at one or more defined frequencies.

14. The method of claim 13, wherein:
the one or more first measurements associated with the first battery cell comprise two or more first measurements associated with two or more different frequencies of the first excitation current, and the one or more second measurements associated with the first battery cell comprise two or more second measurements associated with the two or more different frequencies of the first excitation current.

15. The method of claim 10, further comprising:
selecting, via a multiplexer, a first set of signals and deliver the first set of signals to the ADC to perform the one or more first measurements associated with the first battery cell in the presence of the first excitation current;

selecting, via the multiplexer, a second set of signals and deliver the second set of signals to the ADC to perform the one or more second measurements associated with the first battery cell in the presence of the first excitation current;

selecting, via the multiplexer, a third set of signals and deliver the third set of signals to the ADC to perform the one or more first measurements associated with the second battery cell in the presence of the second excitation current; and selecting, via the multiplexer, a fourth set of signals and deliver the fourth set of signals to the ADC to perform the one or more second measurements associated with the second battery cell in the presence of the second excitation current.

16. The method of claim 10, further comprising:
performing one or more battery management functions on the plurality of battery cells, wherein the battery management functions are based on the plurality of determined impedances of the plurality of battery cells.

17. A battery management system (BMS) configured to monitor a plurality of battery cells arranged in series, the BMS comprising:
a first battery monitoring circuit configured to monitor a first subset of the plurality of battery cells; and
a second battery monitoring circuit configured to monitor a second subset of the plurality of battery cells, wherein the second subset is different than the first subset, wherein the first battery monitoring circuit and the second battery monitoring circuit each comprise:
an impedance measurement circuit configured to determine an impedance of a given battery cell, the impedance measurement circuit comprising:
a current excitation unit configured to deliver an excitation current to the given battery cell; and
an analog-to-digital converter (ADC) configured to:
perform one or more first measurements associated with the given battery cell in the presence of the excitation current, wherein the one or more first measurements comprise one or more current measurements, and
perform one or more second measurements associated with the given battery cell in the presence of the excitation current, wherein the one or more second measurements comprise one or more voltage measurements,
wherein the impedance of the given battery cell is based on the one or more first measurements and the one or more second measurements.

18. The BMS of claim 17, wherein the impedance measurement circuit associated with each of the first battery monitoring circuit and the second battery monitoring circuit is configured to determine a plurality of impedances associated with a subset of the plurality of battery cells,
wherein for each subset of battery cells, a respective impedance measurement circuit includes a respective current excitation unit configured to deliver a respective excitation current to a respective battery cell,
wherein the ADC is configured to:
perform one or more first measurements associated with a first battery cell in the presence of a first excitation current,
perform one or more second measurements associated with the first battery cell in the presence of the first excitation current,
perform one or more first measurements associated with a second battery cell in the presence of a second excitation current, and
perform one or more second measurements associated with the second battery cell in the presence of the second excitation current.

* * * * *